United States Patent
Walker et al.

(10) Patent No.: US 6,711,391 B1
(45) Date of Patent: Mar. 23, 2004

(54) GAIN LINEARIZER FOR VARIABLE GAIN AMPLIFIERS

(75) Inventors: Brett C. Walker, San Diego, CA (US); Eric Zeisel, San Diego, CA (US); Gurkanwal S. Sahota, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 430 days.

(21) Appl. No.: 09/686,265

(22) Filed: Oct. 10, 2000

(51) Int. Cl.⁷ ............................................... H04B 1/06
(52) U.S. Cl. ................... 455/234.1; 455/127.3
(58) Field of Search ........................ 455/234.1, 127.3, 455/194.2, 253.2, 311, 341, 144; 330/51, 254, 256, 257, 300, 310

(56) References Cited

U.S. PATENT DOCUMENTS

| | | | |
|---|---|---|---|
| 4,567,441 A | * 1/1986 | Main | ........................... 329/318 |
| 4,796,188 A | 1/1989 | Gale et al. | |
| 5,572,166 A | 11/1996 | Gilbert | |
| 5,812,008 A | 9/1998 | Nigel | |
| 5,828,710 A | 10/1998 | Beale | |
| 5,880,631 A | 3/1999 | Sahota | |
| 5,999,053 A | 12/1999 | Eschauzier | |
| 6,084,471 A | * 7/2000 | Ruth et al. | ................... 330/254 |
| 6,124,761 A | 9/2000 | Robinson et al. | ........... 330/254 |
| 6,215,989 B1 | * 4/2001 | Otaka | ....................... 455/234.1 |
| 6,300,811 B1 | * 10/2001 | Dick | ........................... 327/252 |
| 6,420,934 B1 | * 7/2002 | Butler et al. | ................. 330/279 |
| 6,445,251 B1 | 9/2002 | Robinson | .................... 330/254 |
| 6,480,066 B1 | * 11/2002 | Madni | ........................ 330/254 |

* cited by examiner

*Primary Examiner*—Nay Maung
*Assistant Examiner*—Tu Nguyen
(74) *Attorney, Agent, or Firm*—Philip R. Wadsworth; Charles D. Brown; Nicholas J. Pauley

(57) ABSTRACT

Techniques to linearly (in dB) adjust the gains of variable gain elements (i.e., variable gain amplifiers or VGAs) in a receiver or transmitter. An input control signal is provided to a conditioning circuit that conditions the control signal to achieve various signal characteristics. The input control signal is limited to within a particular range of values, temperature compensated, scaled (or normalized) to the supply voltages, shifted with an offset, or manipulated in other fashions. The conditioned signal is then provided to an input stage of a linearizer that generates a set of exponentially related signals. This is achieved using, for example, a differential amplifier in which the conditioned control signal is applied to the inputs of the differential amplifier and the collector currents from the differential amplifier comprises the exponentially related signals. An output stage within the linearizer receives the exponentially related signals and, in response, generates a gain control signal. By approximately matching the output stage to a gain stage of the variable gain element and by using the gain control signal generated by output stage, the gain transfer function of the VGA approximates that of the exponentially related signals.

9 Claims, 11 Drawing Sheets

GAIN LINEARIZER FOR VARIABLE GAIN AMPLIFIERS

BACKGROUND OF THE INVENTION

I. Field of the Invention

The present invention relates to communications circuits. More particularly, the present invention relates to novel and improved techniques for adjusting the gain of variable gain amplifiers.

II. Description of the Related Art

Variable gain amplifiers (VGAs) are commonly used in communications receivers and transmitters to provide adjustable gain, and thus variable signal amplitude, depending on, for example, operating conditions, system requirements, or other factors. In particular, some transmitters are required to provide a range of adjustment in their output power. One application that requires this power adjustment is a Code Division Multiple Access (CDMA) communications system.

In the CDMA system, the signal from each user is spectrally spread over the entire (e.g., 1.2288 MHz) system bandwidth. Thus, the transmitted signal from each transmitting user acts as interference to those of other users in the system. To increase system capacity, the output power of each transmitting remote station is adjusted such that a required level of performance (e.g., a particular bit error rate) is maintained while minimizing interference to other users.

The transmitted signal from the remote station is affected by various transmission phenomena, including path loss and fading. These phenomena, in combination with the need to control the transmit power, can impose a difficult specification on the required transmit power control range. In fact, for the CDMA system, each remote station transmitter is typically designed with the capability to adjust its output power over a range of greater than 85 dB.

The power adjustment for CDMA remote stations is typically provided by one or more variable gain amplifiers in the transmit signal path. The power adjustment is normally performed in increments that are typically specified. For example, for CDMA remote stations that conform to the IS-95-A standard, the output power is adjusted in 0.5 dB increments.

For ease of compliance with the power adjustment specification and for other system considerations, it is advantageous to be able to linearly adjust the gain (in dB) of at least one variable gain amplifier in the transmit signal path. Linear in dB gain versus control voltage corresponds to an exponential gain transfer function. For some VGA designs, the exponential gain is achieved with a differential amplifier stage that provides an output current that varies exponentially in response to a differential input control voltage. The transfer function for the differential amplifier is approximately linear in dB, but compresses at large control voltages.

VGAs having transfer functions that are not linear in dB can cause degraded performance. For example, a "distorted" (i.e., not linear) transfer function can make it more difficult or challenging to accurately set the transmit output power to a particular level. In CDMA systems, this inaccuracy can result in degraded performance for a particular remote station (if the output power is set too low) or lower system capacity (if the output power is set too high). The distorted transfer function can also affect other circuits (e.g., the AGC loop) that depend on the gain slope of the VGA. For example, a non-linear gain versus control voltage can lead to large gain slopes, which allow noise to more easily transfer onto the transmitted signal. The large gain slopes can also disturb the stability of the AGC loop.

Several advantages may be obtained by the use of VGAs that are linear in dB. For example, linear in dB VGAs may reduce the requirement for the RF calibration. Voltages from linear in dB VGAs can also be provided to an AGC loop to generate a log (amplitude) detector, which is useful in some applications.

Accordingly, techniques that allow for linear (in dB) adjustment of a variable gain element are highly desirable.

SUMMARY OF THE INVENTION

The present invention provides techniques to linearly (in dB) adjust the gains of variable gain elements (i.e., variable gain amplifiers or VGAs) in a receiver or transmitter. An input control signal is provided to a conditioning circuit that conditions the control signal to achieve various signal characteristics. For example, the input control signal can be limited to within a particular range of values, temperature compensated, scaled (or normalized) to the supply voltages, shifted with an offset, or manipulated in other fashions. The conditioned signal is then provided to an input stage of a linearizer that generates a set of exponentially related signals. This can be achieved using, for example, a differential amplifier in which the conditioned control signal is applied to the inputs of the differential amplifier and the collector currents from the differential amplifier comprise the exponentially related signals. The differential amplifier can be implemented, for example, with a BJT differential air. An output stage within the linearizer receives the exponentially related signals and, in response, generates a gain control signal. By approximately matching the output stage to a gain stage of the variable gain element and by using the gain control signal generated by output stage, the gain transfer function of the VGA can approximate that of the exponentially related signals.

An embodiment of the invention provides a linearizer circuit for providing a control signal for a variable gain element. The linear includes a first circuit coupled to a second circuit. The first circuit is configured to receive an input signal and generate exponentially related signals. The second circuit is configured to receive the exponentially related signals and generate the control signal in response to the received exponentially related signals. The second circuit is approximately matched to a gain circuit within the variable gain element. In a specific implementation, the first circuit or the second circuit, or both, can each be implemented with a differential amplifier. For improved performance, the second circuit can be matched (as closely as possible) to the gain stage of the variable gain element. The input signal can also be conditioned to achieve various signal characteristics such as being limited to within a particular range of values, temperature compensated, continuously adjustable, adjustable in discrete steps, offset vertically in discrete steps, and others.

Another embodiment of the invention provides a gain control circuit for providing a gain control signal for a variable gain element. The gain control circuit includes a conditioning circuit coupled to a linearizer circuit. The conditioning circuit is configured to receive and condition an input control signal to generate a conditioned control signal. The linearizer circuit is configured to receive and process the conditioned control signal to generate the gain control signal. The gain control signal, over a particular range of values, provides an approximately linear, in dB, gain transfer function in the variable gain element. The conditioning circuit can include zero or more of the following circuits: a clipping circuit, a temperature compensation circuit, a summing circuit, and other circuits. The clipping circuit is configured to receive the input signal and provide a clipped signal that is limited to a range of values defined by an upper limit and a lower limit. The temperature compensation circuit is configured to receive an input signal and provide a temperature compensated signal such that the gain transfer function in the variable gain element is approximately invariant to temperature variations. The summing circuit is configured to receive an input signal and a trim signal and to combine the signals to generate a combined signal. These circuits can be arranged in various orders.

Yet another embodiment of the invention provides a circuit for processing an analog signal. The processing circuit includes at least one variable gain element coupled in series and operative to receive an analog signal. Each variable gain element provides a particular gain for the analog signal based on a respective gain control signal. The processing circuit further includes at least one gain control circuit coupled to the variable gain element(s). Typically, one gain control circuit is provided for each variable gain element. One or more of the gain control circuit(s) can be designed to include a linearizer circuit. The linearizer circuit is configured to receive and process an input control signal to generate the gain control signal. The gain control signal, over a particular range of values, provides an approximately linear (in dB) gain transfer function in the variable gain element operative to receive that gain control signal. The gain control circuit can also be designed to include a conditioning circuit coupled to the linearizer circuit. The conditioning circuit can include zero or more of the following circuits: a clipping circuit, a temperature compensation circuit, a summing circuit, and other circuits. The processing circuit can be included, for example, within a receiver or a transmitter that can be used, for example, in a cellular telephone.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein.

DETAILED DESCRIPTION OF THE SPECIFIC EMBODIMENTS

Figure 1:
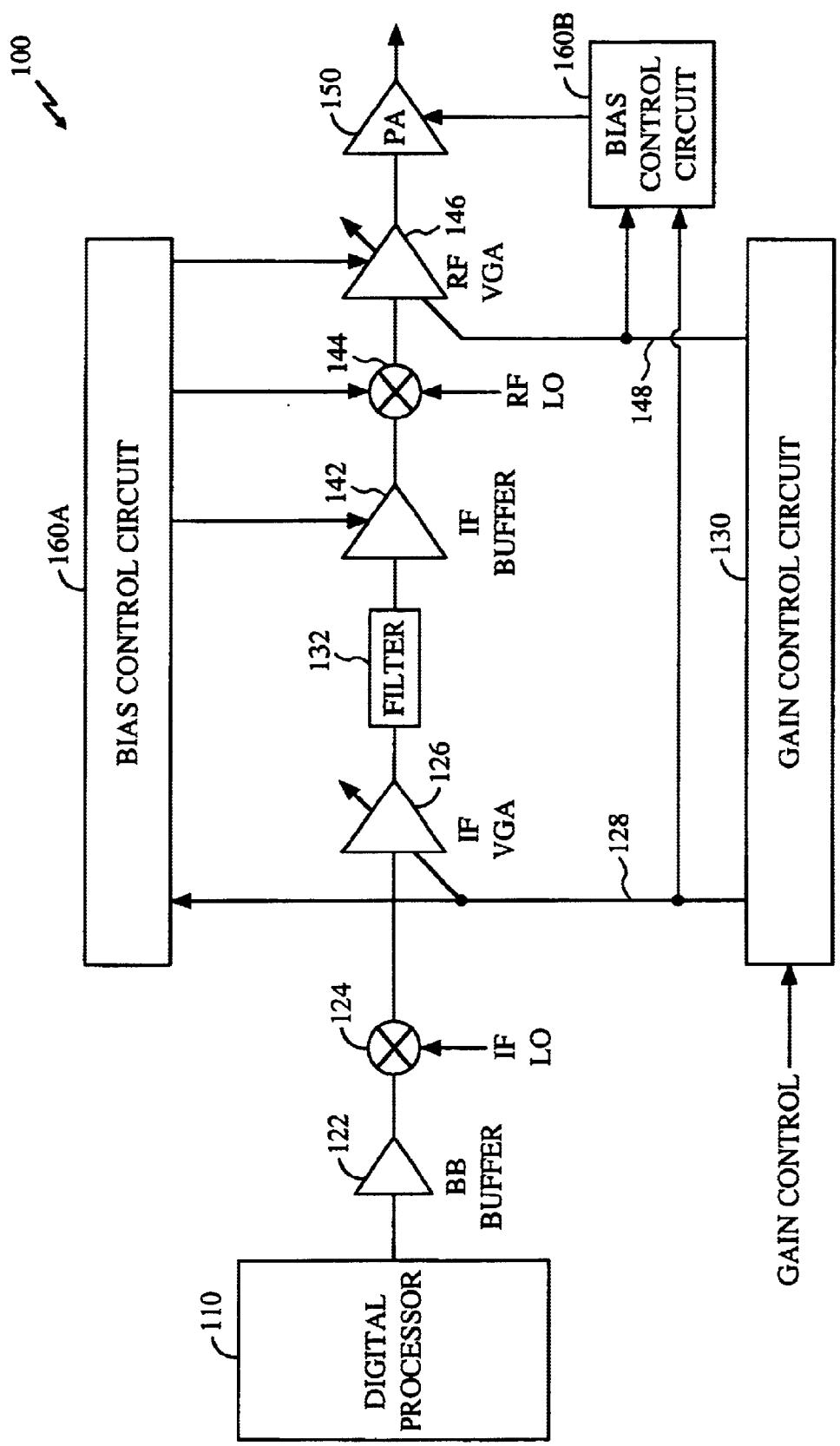
FIG. 1 shows a simplified block diagram of an embodiment of a transmitter.

FIG. 1 shows a simplified block diagram of an embodiment of a transmitter 100. A digital processor 110 generates data, encodes and modulates the data, and converts the digitally processed data into an analog signal. The analog signal is provided to a baseband (BB) buffer 122 that buffers the signal and provides the buffered signal to a mixer 124. Mixer 124 also receives a local sinusoid at an intermediate frequency (IF LO), and upconverts the buffered baseband signal with the IF LO to generate an IF signal. The IF signal is provided to an IF variable gain amplifier (IF VGA) 126 that amplifies the signal with a gain determined by a gain control signal 128 from a gain control circuit 130. The amplified IF signal is provided to a filter 132 that filters the IF signal to remove out-of-band noise and undesired signals.

The filtered IF signal is provided to an IF buffer 142 that buffers the signal and provides the buffered IF signal to a mixer 144. Mixer 144 also receives a local sinusoid at a radio frequency (RF LO), and upconverts the buffered IF signal with the RF LO to generate a RF signal. The RF signal is provided to a RF VGA 146 that amplifies the signal with a gain determined by a gain control signal 148 from gain control circuit 130. The amplified RF signal is provided to a power amplifier (PA) 150 that provides the required signal drive. The output of PA 150 couples to an antenna via an isolator and a duplexer (all three elements not shown in FIG. 1).

Figure 2:
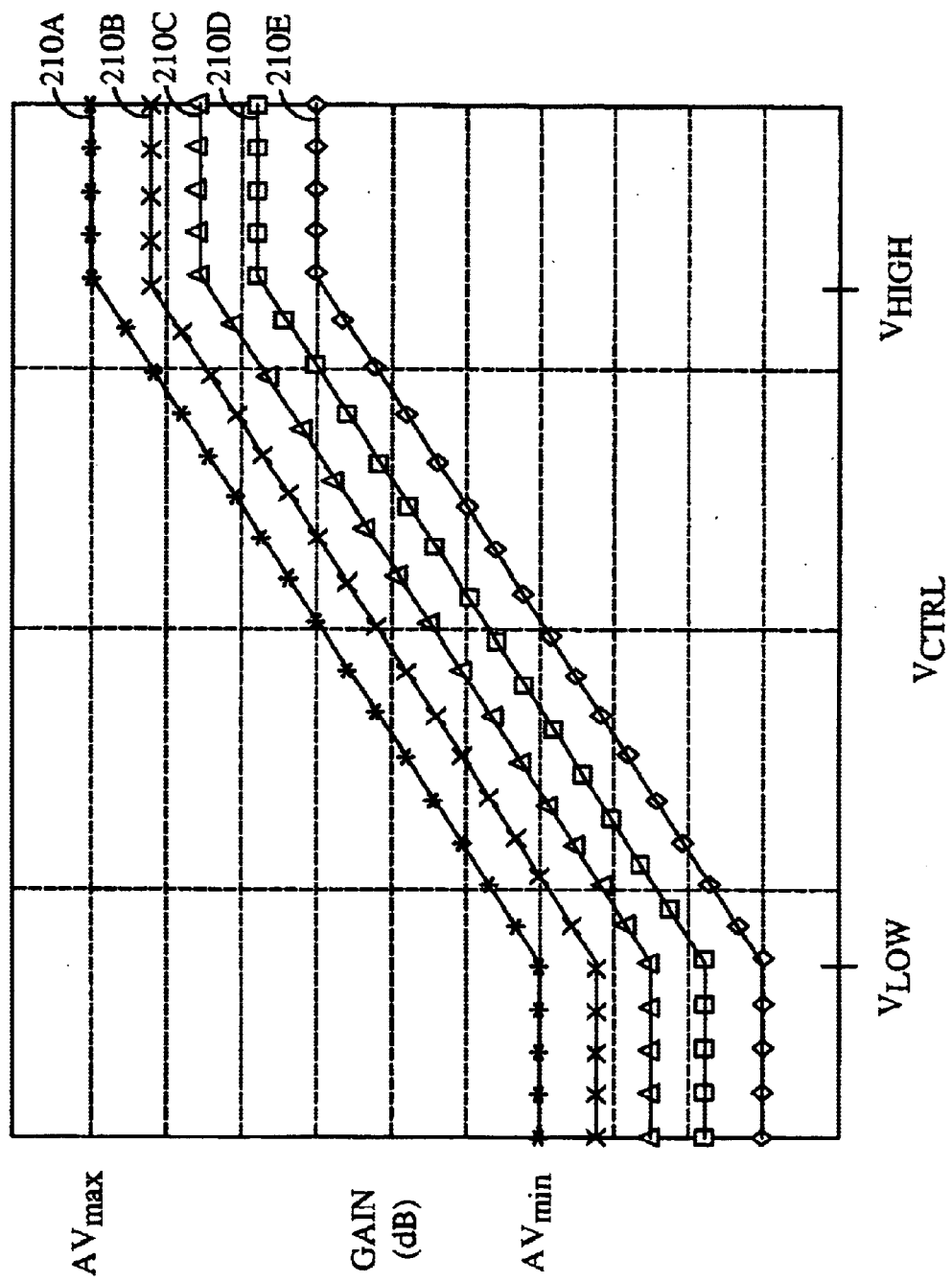
FIG. 2 shows a plot of a specific (and ideal) set of gain transfer functions for a variable gain amplifier (VGA)

FIG. 2 shows a plot of a specific (and ideal) set of gain transfer functions 210a through 210e for a variable gain amplifier. In an embodiment, each gain transfer functions has fixed gains at low and high control voltages and linear dB gain over intermediate control voltages. As shown in FIG. 2, gain transfer function 210a has a gain of $A_{Vmin}$ for control voltages below $V_{LOW}$, $A_{Vmax}$ for control voltages greater than $V_{HIGH}$, and $\{(A_{Vmax}-A_{Vmin})/(V_{HIGH}-V_{LOW})\}$ gain slope for control voltages between $V_{LOW}$ and $V_{HIGH}$. In a specific embodiment, $V_{LOW}$ is set at one-sixth of full-scale voltage and $V_{HIGH}$ is set at five-sixth of full-scale voltage. In actual implementations, gain transfer functions 210a through 210e are more rounded near $V_{HIGH}$ and $V_{LOW}$.

For improved noise and linearity performance, it is sometimes advantageous to be able to displace the gain transfer function vertically by discrete gain amounts. As shown in FIG. 2, the gain transfer functions are similar in shape, but are displaced up or down.

Figure 3B:
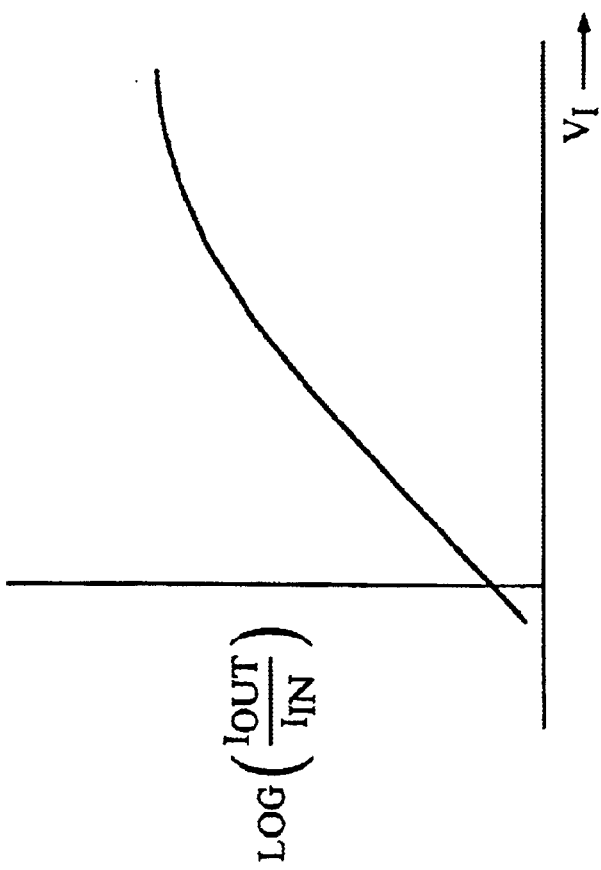
FIG. 3B shows a plot of the logarithm of the transfer function of the differential amplifier in FIG. 3A.
Figure 3A:
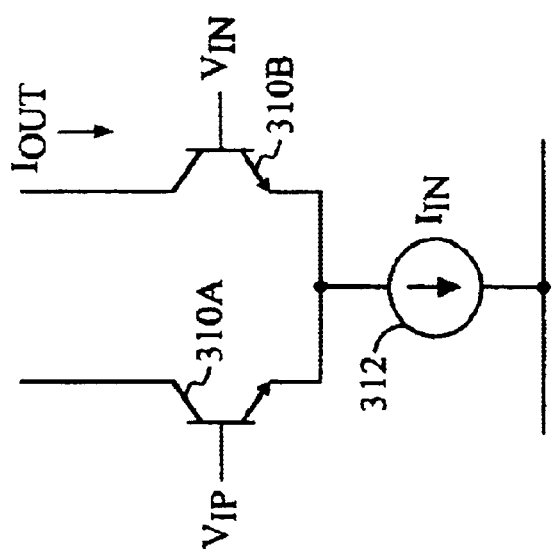
FIG. 3A shows a schematic diagram of a simplified differential amplifier that can be used to provide approximately exponential (or linear in dB) gain.

FIG. 3A shows a schematic diagram of a simplified differential amplifier 310 that can be used to provide an approximately exponential (or linear in dB) gain transfer function. Differential amplifier 310 includes a pair of transistors 310a and 310b coupled together-at the emitter and to a current source 312. The differential input control voltages $V_{IP}$ and $V_{IN}$ are provided to the bases of transistors 310a and 310b, respectively. The output current $I_{OUT}$ from the collector of transistor 310b varies with the control voltage and the transfer function of the differential amplifier can be expressed as:

$$\frac{I_{OUT}}{I_{IN}} = \frac{e^{-V_I/V_T}}{1+e^{-V_I/V_T}}, \quad \text{Eq. (1)}$$

where $V_I = V_{IP} - V_{IN}$ and $V_T$ is the thermal voltage that can be expressed as:

$$V_T = \frac{kT}{q}, \quad \text{Eq. (2)}$$

where k is the Boltzman constant, T is the temperature (in Kelvin), and q is the electron charge. $V_T$ is a temperature dependent term and can be approximated as $V_T \cong 26$ mV at 300° Kelvin.

FIG. 3B shows a plot of the logarithm of the transfer function in equation (1). For large positive control voltages (i.e., $V_I >> V_T$) the denominator in equation (1) approaches 1.0, and the gain of differential amplifier 310 is determined by the numerator and is approximately linear in dB. For large negative control voltages (i.e., $V_I << -V_T$), the exponential term in the denominator begins to dominate, and the gain of differential amplifier 310 compresses toward a gain of 1.0. Thus, the gain transfer function of the differential amplifier is approximately linear in dB over a limited range of control voltages.

Figure 4:
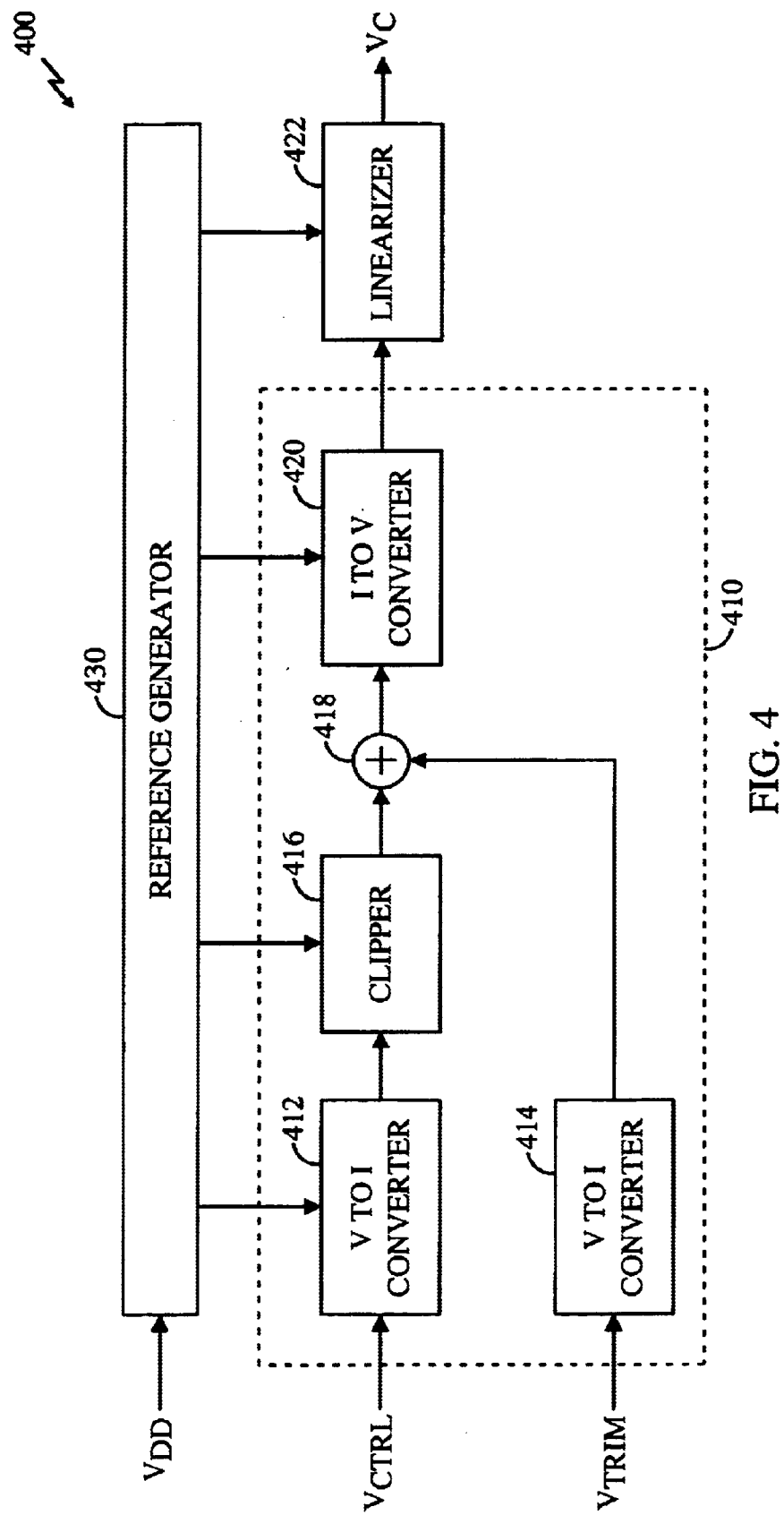
FIG. 4 shows a block diagram of an embodiment of a gain control circuit for generating a gain control signal VG that allows for linear (in dB) adjustment of a variable gain amplifier.

FIG. 4 shows a block diagram of an embodiment of a gain control circuit 400 for generating a gain control signal $V_G$ that allows for linear (in dB) adjustment of a variable gain amplifier (VGA). Referring to FIG. 1, the transmit signal path can include multiple VGAs. Typically, one gain control circuit is provided to generate a gain control signal for each VGA. Thus, gain control circuit 130 can include multiple gain control circuits 400 (i.e., one for each VGA), or any number of gain control circuits 400 in combination with other types of gain control circuits. Alternatively, the gain control signal can be shared by multiple VGAs.

In the specific embodiment shown in FIG. 4, gain control circuit 400 includes a conditioning circuit 410 coupled in series with a linearizer 422. Conditioning circuit 410 receives and conditions an input control signal $V_{CTRL}$ to provide a conditioned control signal $V_C$. The conditioned control signal can have various characteristics, depending on the particular design of conditioning circuit 410. For example, the conditioned control signal can be: (1) limited (i.e., clipped) to within a particular range of values, (2) adjustable upward or downward by a particular offset amount, (3) temperature compensated, (4) scaled (i.e., "normalized") according to the supply voltage, and so on. Linearizer 422 receives the conditioned control signal $V_C$ and generates a gain control signal $V_G$ that drives the VGA.

Within conditioning circuit 410, the input control signal $V_{CTRL}$ is provided to a voltage-to-current (V-to-I) converter 412 that converts the control signal to a control current $I_{CTRL}$ Similarly, an input trim signal $V_{TRIM}$ is provided to a V-to-I converter 414 that converts the trim signal to a trim current $I_{TRIM}$. The control current $I_{CTRL}$ is provided to a clipping circuit 416 that clips the current signal, as necessary, to maintain the signal within a particular range of values. The clipped current signal and the trim current $I_{TRIM}$ are provided to a summer 418 that combines the currents to generate a combined current $I_{SUM}$ that is provided to a current-to-voltage (I-to-V) converter 420. Converter 420 generates the conditioned control signal $V_C$ based on the combined current $I_{SUM}$ and provides the conditioned control signal to linearizer 422. Converter 420 also performs temperature compensation for the control signal.

Linearizer 422 is responsive to the conditioned control signal $V_C$ and generates a gain control signal $V_G$, that linearly (in dB) controls the gain of a VGA (not shown in FIG. 4). A reference generator 430 receives the supply voltage $V_{DD}$, generates a set of bias currents and voltages using a temperature and supply compensated reference source (e.g., a bandgap reference circuit), and provides the bias currents and voltages to the respective circuits.

FIG. 4 shows a specific embodiment of conditioning circuit 410. Different designs to provide different sets of signal characteristics can be implemented and are within the scope of the invention. Moreover, the linearizer can be operated without the conditioning circuit.

Figure 5:
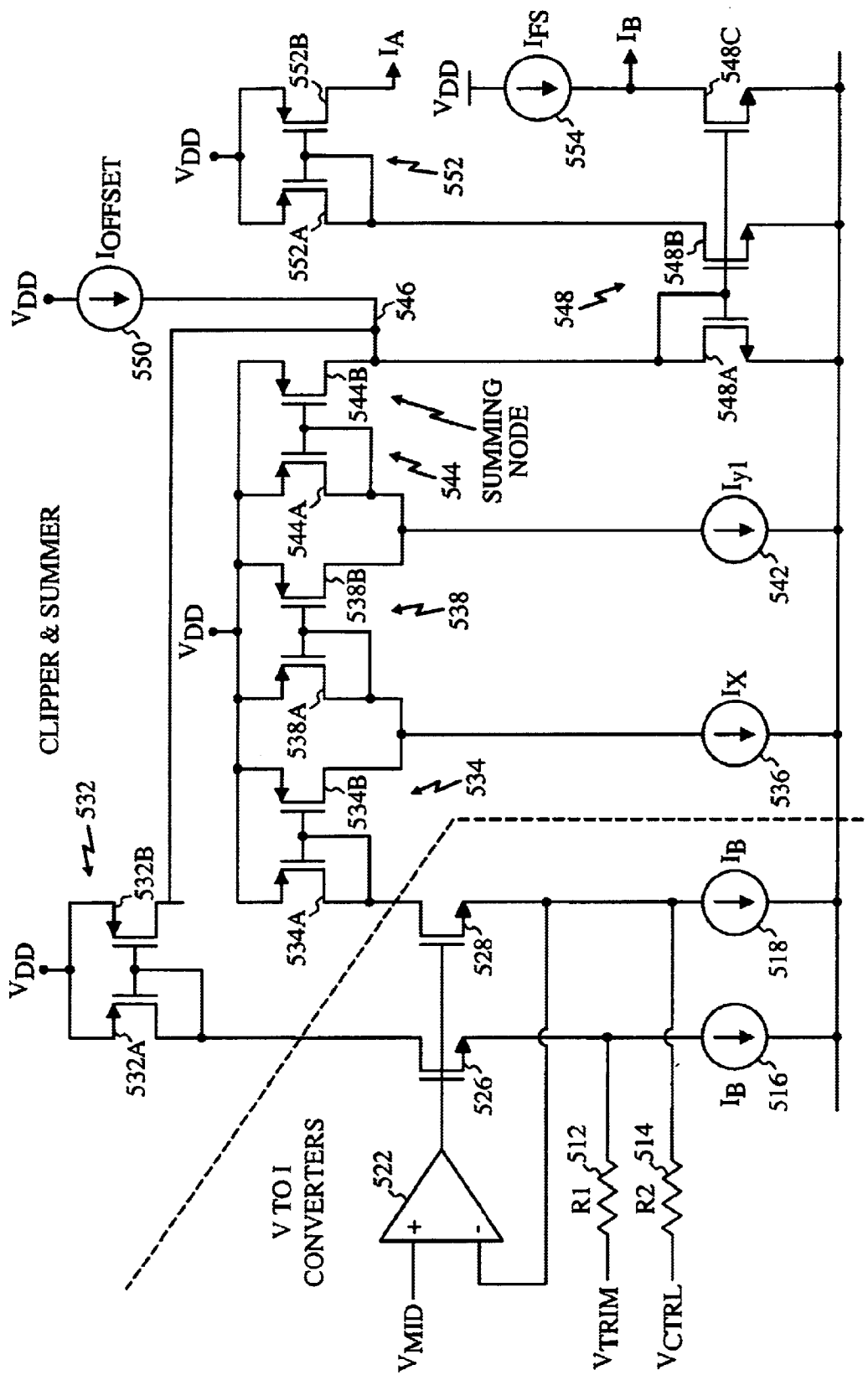
FIG. 5 shows a schematic diagram of a specific embodiment of two V-to-I converters, a clipping circuit, and a summer within the gain control circuit.

FIG. 5 shows a schematic diagram of a specific embodiment of V-to-I converters 412 and 414, clipping circuit 416, and summer 418. The control signal $V_{CTRL}$ and the trim signal $V_{TRIM}$ are provided to one end of resistors 512 and 514, respectively. The other end of resistors 512 and 514 couple to current sources 516 and 518, respectively. The resistors and current sources function to convert the control and trim voltages to control and trim currents.

An amplifier 522 receives a midscale voltage $V_{MID}$ at the non-inverting input terminal. The output of amplifier 522 couples to the gates of N-channel transistors 526 and 528. The source of N-channel transistor 528 couples to the inverting input of amplifier 522 and forms a feedback path. The sources of N-channel transistors 526 and 528 couple to current sources 516 and 518, respectively. The drains of N-channel transistors 526 and 528 couple to the reference paths of current mirror circuits 532 and 534, respectively. Current mirror circuit 532 is formed by P-channel transistor 532a and 532b, and current mirror circuit 534 is formed by P-channel transistors 534a and 534b.

In the embodiment shown in FIG. 5, the control signal $V_{CTRL}$ is single-ended and is compared to the midscale voltage $V_{MID}$ by amplifier 522. The midscale voltage facilitates the generation of a differential signal (or complementary signals) from a single-ended signal. The midscale voltage can be generated by reference generator 430 noted above. For a differential control signal $V_{CTRL}$ (i.e., comprising $V_{CTRL+}$ and $V_{CTRL-}$), one of the control signals can be provided to the non-inverting input of amplifier 522 or, alternatively, a differential input stage can be used.

The control current $I_{CTRL}$ in the reference path (i.e., via P-channel transistor 534a) of current mirror circuit 534 is related to the control signal $V_{CTRL}$. This control current $I_{CTRL}$ is then clipped, as necessary, by a subsequent clipping circuit.

In the embodiment shown in FIG. 5, the clipping circuit comprises current sources 536 and 542 and current mirror circuits 538 and 544. The mirror path (i.e.,via P-channel transistor 534b) of current mirror circuit 534 couples in series with current source 536 and in parallel with the reference path of current mirror circuit 538. The mirror path (i.e., via P-channel transistor 538b) of current mirror circuit 538 couples in series with current source 542 and in parallel with the reference path of current mirror circuit 544. The current in the mirror path (i.e., via P-channel transistor 544b) of current mirror circuit 544 is the clipped control current.

Figure 6A:
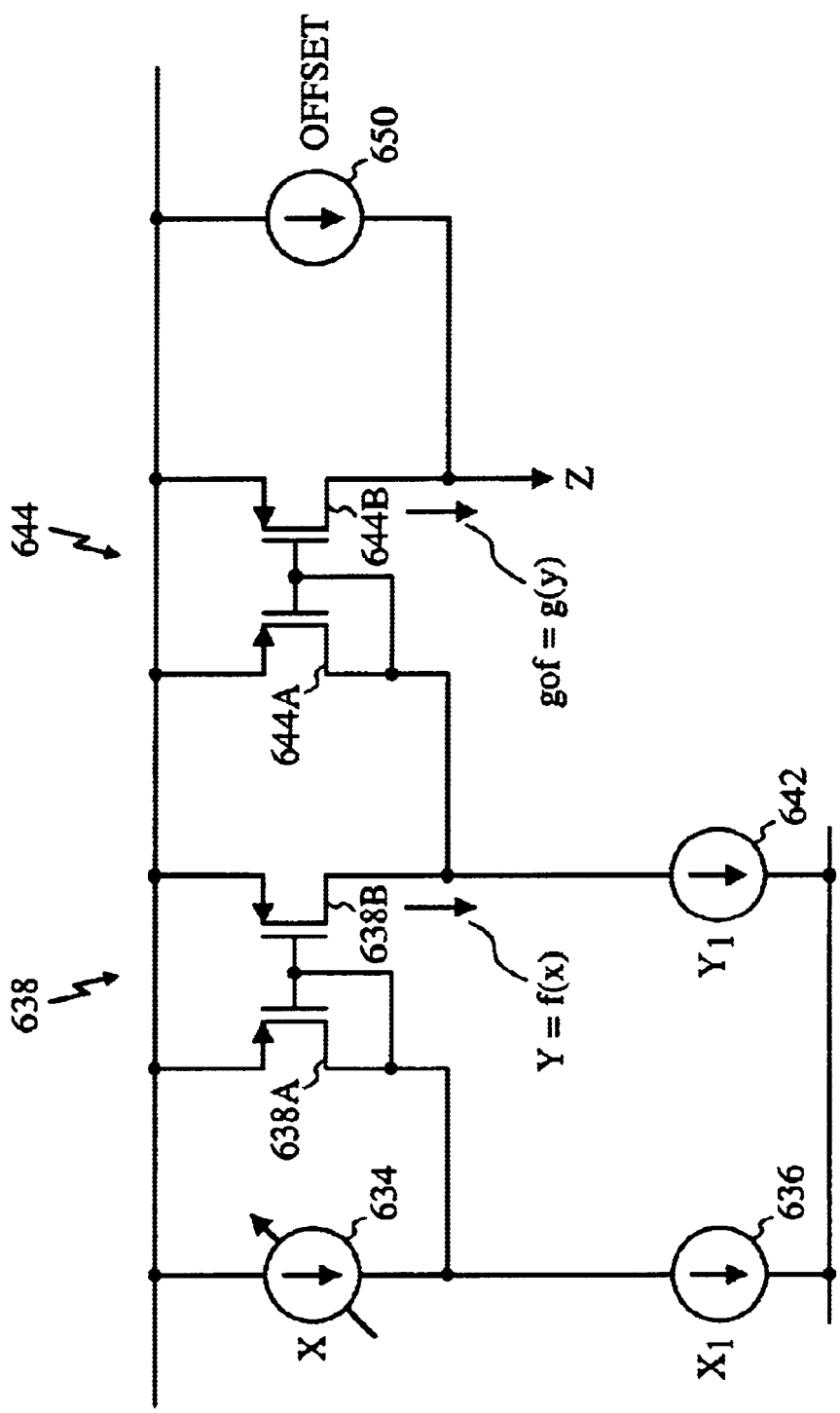
FIG. 6A shows a schematic diagram of a simplified model of the clipping circuit

FIG. 6A shows a schematic diagram of a simplified model of the clipping circuit. In this model, current sources 636, 642, and 650 correspond to current sources 536, 542, and 550 in FIG. 5, and current mirror circuits 638 and 644 correspond to current mirror circuits 538 and 544. The input current x is represented by a current source 634. When the input current x is greater than the current $x_1$ of current source 636, P-channel transistor 638a turns off and the current through P-channel transistor 638b is approximately zero. Alternatively, when the input current x is less than the current $x_1$, the current through P-channel transistor 638b is $y=f(x)=\alpha(x_1-x)$, where $\alpha$ is a scaling factor that is determined by the ratio of the sizes of P-channel transistors 638a and 638b.

Similarly, when the current y is greater than the current $y_1$ of current source 642, P-channel transistor 644a turns off and the current through P-channel channel transistor 644b is approximately zero. Alternatively, when the current y is less than the current $y_1$, the current through P-channel transistor 642b is $z=g(y)=\beta(y_1-y)$, where $\beta$ is another scaling factor that is determined by the ratio of the sizes of P-channel transistors 644a and 644b. The transfer functions can be summarized as follows:

$$f(x) = \begin{cases} 0, & x \geq x_1 \\ \alpha(x_1-x), & x < x_1 \end{cases}, \text{ and} \qquad \text{Eq(3)}$$

$$g(y) = \begin{cases} 0, & y \geq y_1 \\ \beta(y_1-y), & y < y_1 \end{cases}. \qquad \text{Eq(4)}$$

Equations (3) and (4) can be combined and expressed as follows:

$$g \circ f = \begin{cases} \beta y_1, & x \geq x_1 \\ \beta(y_1 - \alpha(x_1-x)), & (x_1 - y_1/\alpha) < x < x_1 \\ 0, & x \leq (x_1 - y_1/\alpha) \end{cases} \qquad \text{Eq(5)}$$

Figure 6B:
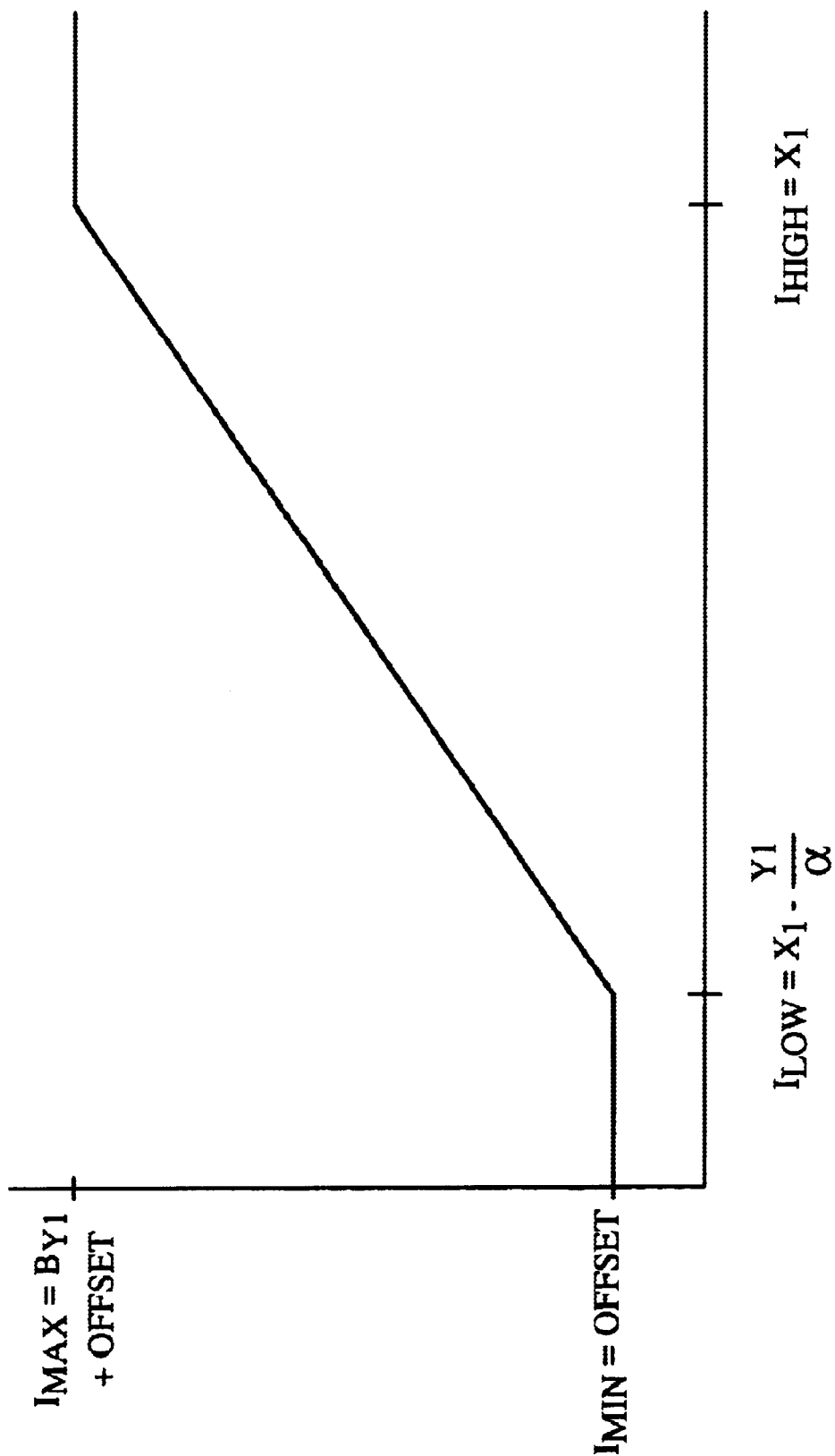
FIG. 6B shows a plot of the transfer function of the clipping circuit.

FIG. 6B shows a plot of the transfer function defined by equation (6). As noted from equation (5), the transfer function $g \cdot f$ is: (1) equal to zero when the input signal x is less than $(x_1-y_1/\alpha)$, (2) equal to $\beta y_1$ when the input signal x is greater than $(x_1,$ and (3) has a slope of $\alpha\beta$ when the input signal x is between the range of $(x_1-y_1/\alpha)$ and $x_1$. The transfer function for the output current z is simply the transfer function $g \cdot f$ shifted vertically by the offset provided by current source 650, and is expressed as:

$$z=g \cdot f+\text{offset}. \qquad \text{Eq(6)}$$

With four degrees of freedom, the upper current limit $I_{MAX}$, the lower current limit $I_{MIN}$, the low input threshold current $I_{LOW}$, and the high input threshold current $I_{HIGH}$ can be set to any particular set of values by adjusting the five variables $x_1$, $y_1$, $\alpha$, $\beta$, and offset. The variables $x_1$ and $y_1$ correspond to the currents of current sources 636 and 642, respectively, which can be set by proper circuit design. The variables $\alpha$ and $\beta$ can be set by controlling the ratio of the transistor sizes in current mirror circuits 638 and 644, respectively. The offset is added to the current from P-channel transistor 644b, to shift the transfer function vertically. The offset can be fixed or programmable to provide the family of curves shown in FIG. 2.

In accordance with an aspect of the invention, a piecewise-linear transfer function can be constructed by concatenating circuits similar to that described above. The five variables of each of the circuits can be adjusted to provide a linear function for a portion of the overall transfer function.

Referring back to FIG. 5, the clipped control current (i.e., from P-channel transistor 544b), the trim current $I_{TRIM}$ (i.e., from P-channel transistor 532b), and the offset current $I_{OFFSET}$ (i.e., from current source 550) are summed together at a summing node 546. The combined current $I_{SUM}$ is provided to the reference path of a current mirror circuit 548 comprised of N-channel transistors 548a, 548b, and 548c. The mirror path through N-channel transistor 548b is coupled to the reference path of a current mirror circuit 552 comprised of P-channel transistors 552a and 552b. The mirror path through N-channel transistor 548c is coupled to a current source 554. The output current signals $I_A$ and $I_B$ are provided via the mirror paths through transistors 552b and 548c, respectively.

The current through P-channel transistor 552b is approximately equal in magnitude to the current through N-channel transistor 548c but differs in polarity (i.e., N-channel transistor 548c provides sinking current and P-channel transistor 552b provide sourcing current). However, the output current signal $I_B$ is the difference between the current $I_{PS}$ in current source 554 and the current through N-channel transistor 548c (e.g., $I_{B=IPS} - I_{548C}$) Thus, if $I_{PS}$ is set at fullscale, the current $I_A$ through N-channel transistor 548a and the current $I_B$ through P-channel transistor 552b are similar in magnitude but out of phase. $I_A$ and $I_B$ are complementary with an offset to ensure that the current stays greater than zero (i.e., $I_A>0$ and $I_B>0$).

Figure 7:
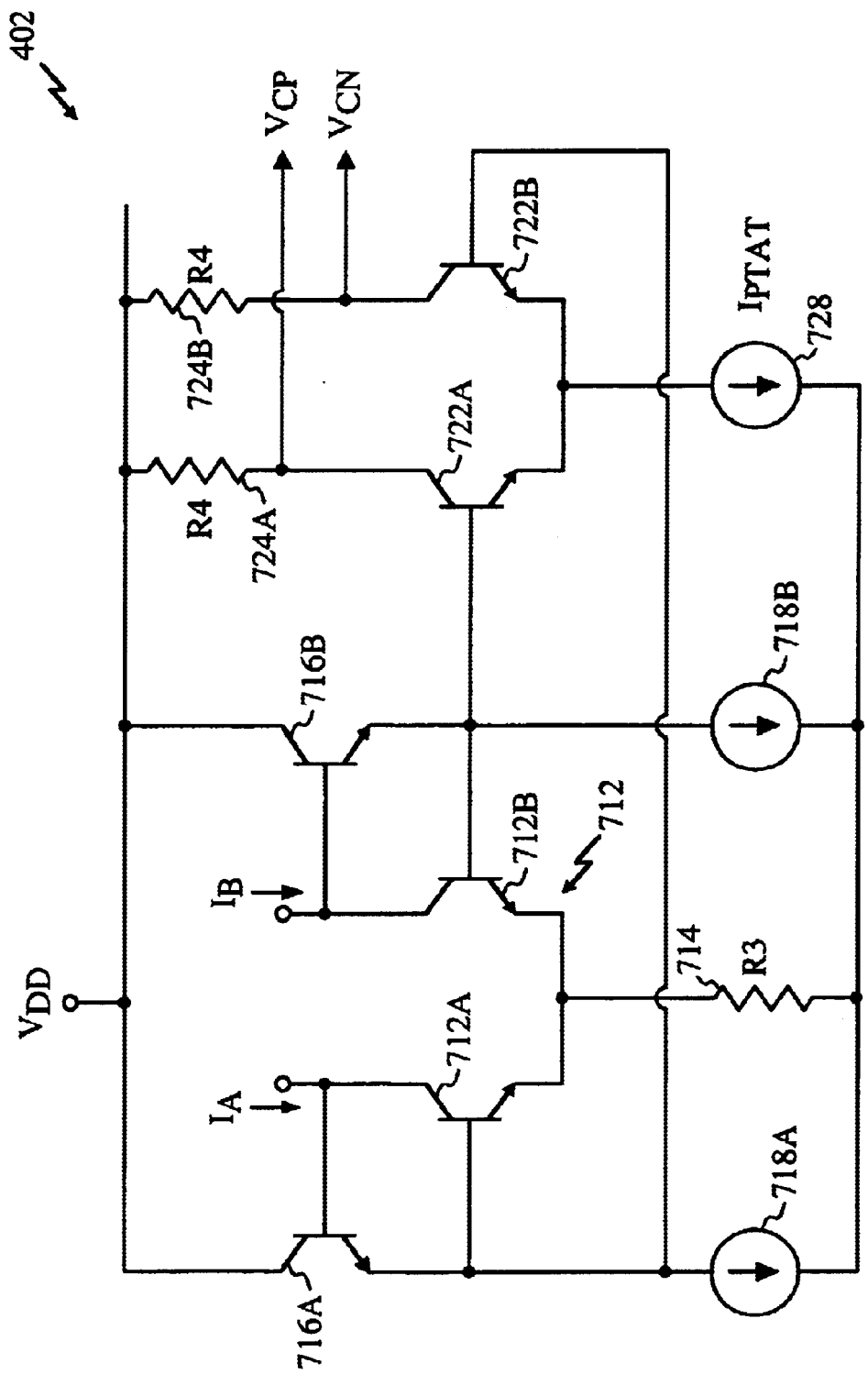
FIG. 7 shows a schematic diagram of a specific embodiment of an I-to-V converter within the gain control circuit.

FIG. 7 shows a schematic diagram of a specific embodiment of I-to-V converter 420. Within converter 420, the current signals $I_A$ and $I_B$ from the output stage of the summing circuit are provided to the collectors of a differential amplifier 712 comprised of transistors 712a and 712b. The emitters of transistors 712a and 712b couple together and in series with a resistor 714. The collectors of transistors 712a and 712b couple to the bases of transistors 716a and 716b, respectively. The collectors of transistors 716a and 716b couple the supply voltage $V_{DD}$, and the emitters of transistors 716a and 716b couple to the bases of transistors 712a and 712b, respectively, and further to current sources 718a and 718b, respectively.

The outputs from the emitters of transistors 716a and 716b couple to the bases of transistors 722a and 722b, respectively. The collectors of transistors 722a and 722b couple to one end of resistors 724b and 724b, respectively, and comprise the conditioned control signals $V_{CP}$ and $V_{CN}$, respectively. The other end of resistors 724b and 724b couple to the supply voltage $V_{DD}$. The emitters of transistors 722a and 722b couple to a current source 728 designed to provide a current of $I_{PTAT}$ proportional to the ratio of $V_T$ and R1 (i.e., $I_{PTAT} \propto V_T/R1$).

Converter 420 generates a differential control voltage $V_C$ in response to the input currents $I_A$ and $I_B$. The circuit comprising transistors 712a, 712b, 716a, 716b, 722a, and 722b generates a differential output voltage based on a differential input current, and also provides temperature compensation. The circuit comprising transistors 812a and 812b generates a differential output currents that are an exponential function (linear in dB) of the differential input voltage. The transfer function for the I-to-V converter can be expressed as follows:

$$V_C = V_{CP} - V_{CN} = \alpha V_T \left( \frac{I_A - I_B}{I_A + I_B} \right), \qquad \text{Eq(7)}$$

where $\alpha V_T$ is related to the current from current source 728.

From equation (7), it can be noted that the differential control voltage $V_C$ is temperature compensated. In particular, the control voltage is "predistorted" such that it is dependent on (i.e., scaled by) $V_T$ in an inverse manner as the subsequent linearizer circuit to be described below. The scaling by $V_T$ provides for a gain control mechanism that is, to a degree, temperature invariant.

Figure 8:
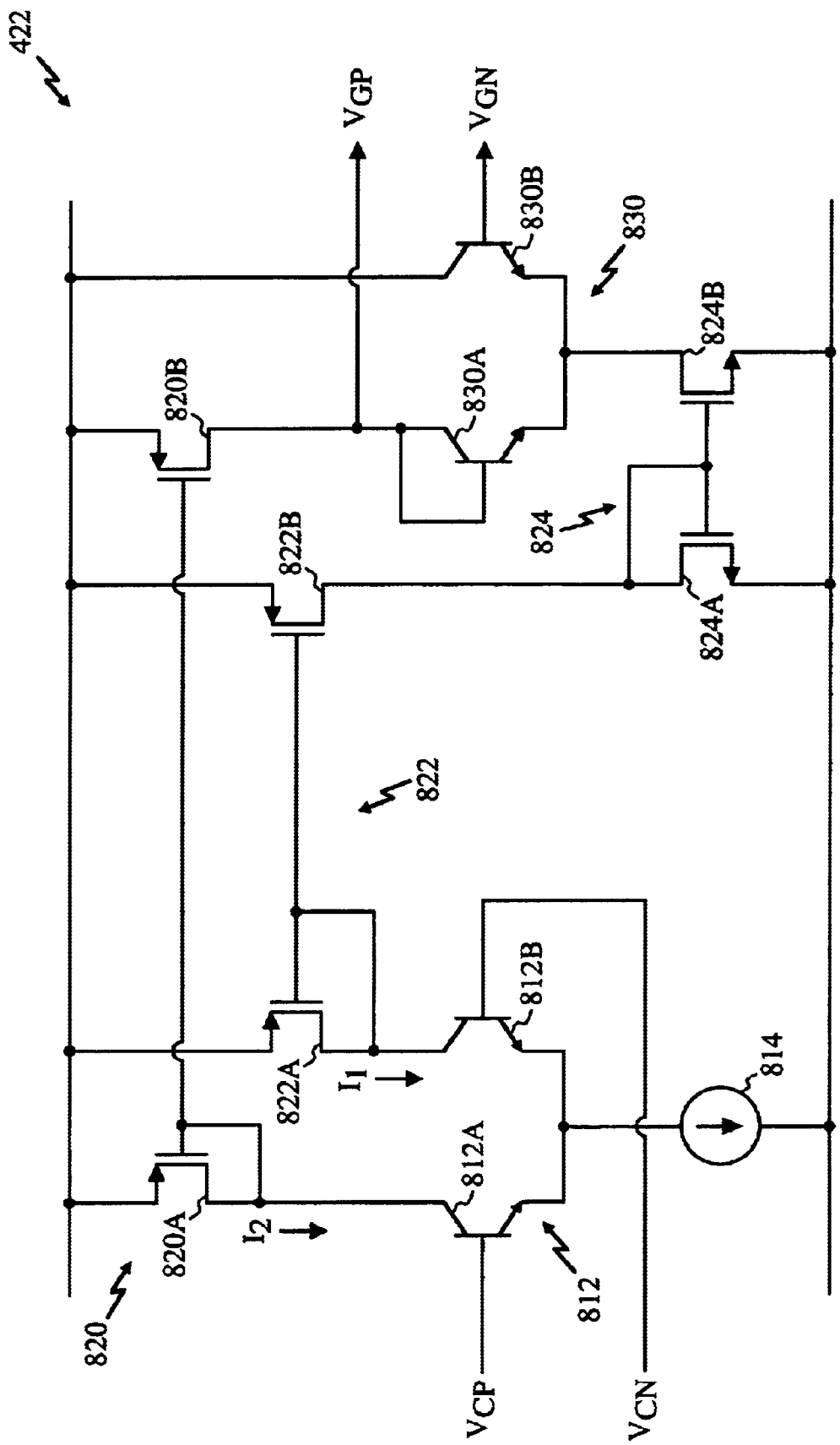
FIG. 8 shows a schematic diagram of a specific embodiment of the linearizer.

FIG. 8 shows a schematic diagram of a specific embodiment of linearizer 422. Linearizer 422 includes an input differential amplifier 812 coupled to an output differential amplifier 830. Differential amplifier 812 comprises a pair of transistors 812a and 812b coupled at the emitter, and differential amplifier 830 comprises a pair of transistors 830a and 830b coupled at the emitter.

Within linearizer 422, the conditioned control signals $V_{CP}$ and $V_{CN}$ from converter 420 are provided to the inputs of differential amplifier 812. The emitters of transistors 812a and 812b couple together and to a current source 814. The collector of transistor 812a couples to the reference path of a current mirror circuit 820 comprised of P-channel transistors 820a and 820b. Similarly, the collector of transistor 812b couples to the reference path of a current mirror circuit 822 comprised of P-channel transistors 822a and 822b.

The mirror path (i.e., via P-channel transistor 822b) of current mirror circuit 822 couples to the reference path of a current mirror circuit 824 comprised of N-channel transistors 824b and 824b. The mirror path (i.e., via P-channel transistor 820b) of current mirror circuit 820 couples to the collector of transistor 830a. The mirror path (i.e., via N-channel transistor 824b) of current mirror circuit 824 couples to the emitters of differential amplifier 830. The collector of transistor 830a also couples to the base of transistor 830a. The bases of transistors 830a and 830b provide the gain control signals $V_{GP}$ and $V_{GN}$, respectively.

The input stage of linearizer 422 receives the differential control signal $V_C$ and generates a set of current signals $I_1$ and $I_2$ that are exponentially related. The transfer function for the ratio of the currents can be expressed as:

$$\frac{I_2}{I_1} = e^{\left(\frac{V_{CP}-V_{CN}}{V_T}\right)}. \qquad \text{Eq(8)}$$

In equation (8), it can be noted that the ratio of the currents (e.g., $I_2/I_1$) is an exponential function (i.e., linear in dB) with respect to the differential control voltage (e.g., $V_C = V_{CP} - V_{CN}$). It can also be noted that the ratio of the currents is a function of $V_T$. However, as shown above in equation (7), the differential control voltage $V_C$ is generated with temperature compensation such that $V_C$ includes a scaling factor of $V_T$. When $V_C$ is applied to equation (8), the $V_T$ term in equations (7) and (8) cancels out and the ratio of the currents ($I_2/I_1$) is, to a large extent, temperature invariant (i.e., not dependent on $V_T$). The ratio of the currents ($I_2/I_1$) is a function of the control signal $V_C$, which is a conditioned signal based on the input control signal $V_{CTRL}$.

As shown in FIG. 8, the current ($I_2$) from one path of input differential amplifier 812 is provided as the current for one path of output differential amplifier 830. The current ($I_1$) from the other path of input differential amplifier 812 is provided as the emitter current for output differential amplifier 830. Differential amplifier 830 generates a differential gain control voltage $V_G$ ($V_G = V_{GP} - V_{GN}$) based on the exponentially related currents signals $I_2$ and $I_1$.

Figure 9:
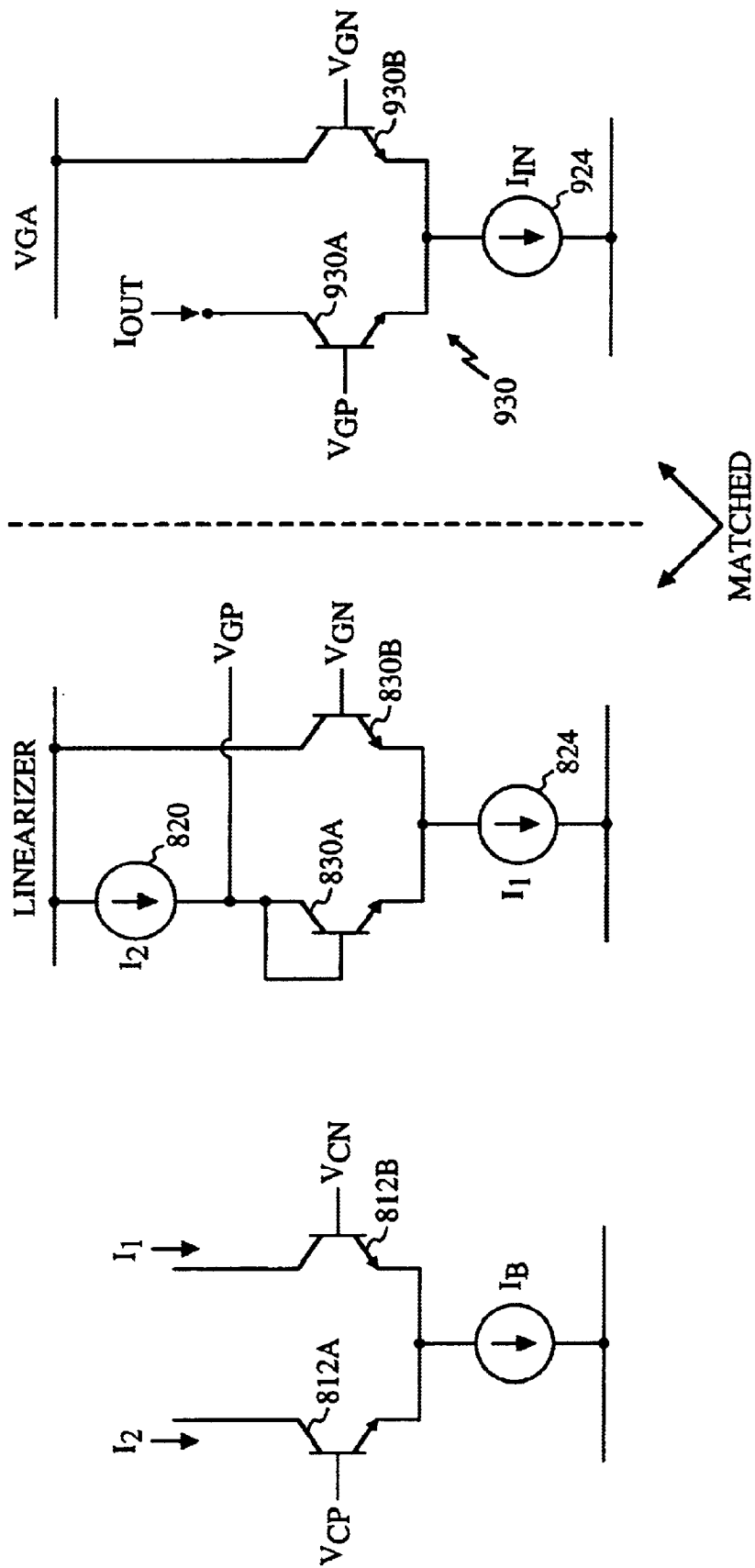
FIG. 9 shows a schematic diagram of a simplified model of the linearizer and the VGA to be controlled by the linearizer.

FIG. 9 shows a schematic diagram of a simplified model of the linearizer and the VGA to be controlled by the linearizer. Input differential amplifier 812 of the linearizer generates currents $I_1$ and $I_2$ that are exponentially related, as shown in equation (8). The output differential amplifier receives the exponentially related currents $I_1$ and $I_2$ and generates a differential gain control voltage $VG$ that is based on, and corresponds to, the exponentially related currents $I_1$ and $I_2$. The differential gain control voltage $V_G$ is provided to the VGA.

The VGA includes a differential amplifier 930 comprised of transistors 930a and 930b that receive the differential gain control voltages $V_{GP}$ and $V_{GN}$, respectively. Differential amplifier 930 generates an output current $I_{OUT}$ that is linearly related to the input current $I_{IN}$, but the gain is exponentially related to the control voltage. For improved performance, differential amplifier 930 is matched (as closely as possible) to differential amplifier 830 and current source 924 is matched to current source 824. Matching the differential amplifiers and current sources may be impractical because, for example, it may be desired to minimize the current consumption of the replica differential amplifier in the control circuit, but the current consumption of the VGA being controlled may be set by other performance requirements. In accordance with an aspect of the invention, resistors are used to improve operational matching of the circuits despite their operation at different current densities.

Since both differential amplifiers 830 and 930 are controlled by the same differential gain control signal $V_G$, and further because of the matching, the ratio of $I_{OUT}$ to $I_{IN}$ is approximately equal to the ratio of the $I_2$ to $I_1$. The transfer function for the VGA can be expressed as:

$$\frac{I_{OUT}}{I_{IN}} \cong \frac{I_2}{I_1} = e^{\left(\frac{V_{CP}-V_{CN}}{V_T}\right)}. \qquad \text{Eq(9)}$$

As shown by equation (9), with the linearizer of the invention, a linear (in dB) gain transfer function can be obtained for a differential amplifier in the VGA. It can be noted that differential amplifier 930 in FIG. 9 is similar in configuration to differential amplifier 310 in FIG. 3A. The linear (in dB) gain transfer function is obtained for differential amplifier 930 by "predistorting" the gain control voltage $V_G$ using the linearizer. In contrast, as shown by equation (1), an approximately linear (again in dB) gain transfer function is obtained over a limited range of values when the gain control voltage is not "predistorted".

Figure 10:
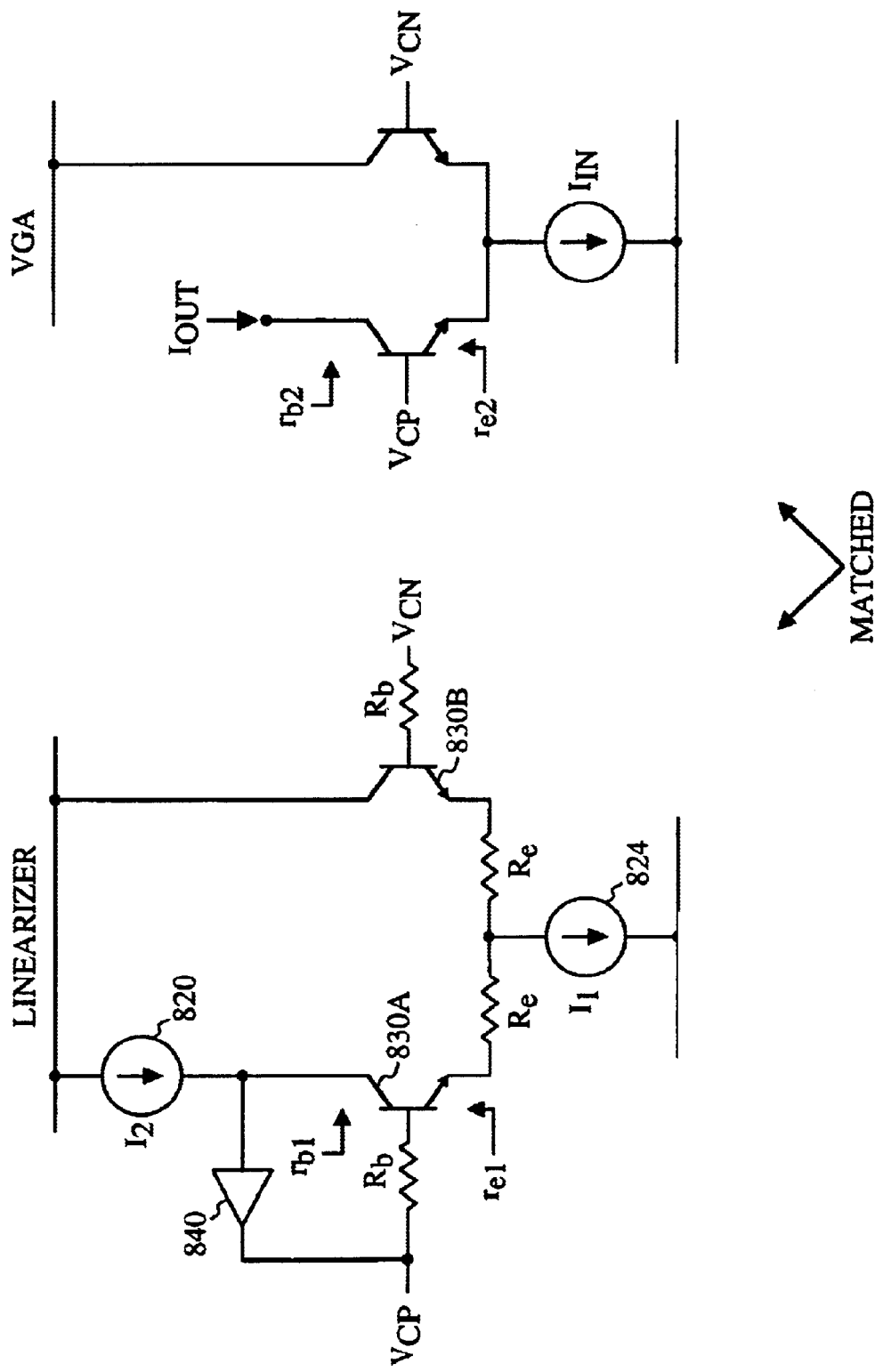
FIG. 10 shows a schematic diagram that illustrates some techniques for matching the linearizer output differential amplifier to the differential amplifier of the VGA.

FIG. 10 shows a schematic diagram that illustrates some techniques for matching the linearizer output differential amplifier to the differential amplifier of the VGA. The linearizer differential amplifier is typically operated at low current to conserve power. In contrast, the VGA differential amplifier is typically operated at higher current to provide the required signal swing, linearity, and noise performance.

For improved performance, the differential amplifiers are physically matched, for example, by designing the transistors with similar sizes and placing the transistors in the same vicinity and with similar orientations. However, some mismatch occurs because of other factors. For example, the VGA devices being controlled are typically operated at high current, and thus their dynamic resistance is small. (The dynamic resistance for a transistor is computed as $r_e \cong V_T/I_C$, where $I_C$ is the bias current for the transistor.) However, the parasitic resistance inherent in the construction of the devices does not change with operating current. The replica devices in the control circuit are operated at lower current, and their parasitic resistance is typically less significant compared to the dynamic resistance. Additional resistance can thus be added to the bases and emitters of the replica devices to approximate the effect of the relatively higher parasitic resistance in the devices being controlled. To match the emitter resistance, an external resistor $R_{ext}$ can be placed between the emitter of the transistor and the current source such that the following is achieved:

$$r_{pe2} \cong r_{pe1} + R_e. \qquad \text{Eq(10)}$$

where $r_{pe}$ is the emitter parasitic resistance. Similarly, to match the base resistance, an external resistor $R_b$ can be placed at the base of the transistor such that the following is achieved:

$$r_{b2} \cong r_{b1} + R_b. \qquad \text{Eq(11)}$$

In an embodiment, a buffer 840 having approximately unit gain is coupled between the collect and base of transistor 830a. Buffer 840 provides biasing for the bases of transistors 830a and 930a.

For clarity, the invention has been described with differential amplifiers implemented using bipolar junction transistors (BJTs). The invention can also be implemented with other circuits including FETs, MOSFETs, MESFETs, HBTs, P-HEMTs, and others. As used herein, "transistor" generically refers to any active circuit, and is not limited to a BJT.

The linearizer of the invention can be used in combination with various variable gain elements including variable gain amplifiers, attenuators (i.e., diodes), multipliers, and other circuits. Generally, the output stage of the linearizer can be designed to approximately match the gain stage of the variable gain element, and the input stage of the linearizer can be designed to generate exponentially related signals that provide the desired linear (in dB) gain transfer function.

The linearizer can be used in a receiver or a transmitter. In fact, the linearizer of the invention can be used in any circuit designed to process an analog signal and including at least one variable gain element. In particular, the linearizer can be advantageously used in a transmitter designed to operate in accordance with one or more variants of IS-95 specifications.

Various modifications can be made to the transmitter embodiment shown in FIG. 1. For example, fewer or additional filter, buffer, and amplifier stages can be provided in the transmit signal path. Moreover, the elements within the signal path can be arranged in different configurations. In addition, the variable gain in the transmit signal path can be provided by VGAs (as shown in FIG. 1), variable attenuators, multipliers, other variable gain elements, or a combination of the above. In a specific implementation, the transmit signal path from BB buffer 122 to PA 150 (possibly excluding filter 132) is implemented within one or more integrated circuits, although discrete elements can also be used.

In one specific transmitter embodiment, quadrature modulation is performed on an inphase (I) baseband signal and a quadrature (Q) baseband signal from the digital processor. In this design, a pair of BB buffers and mixers are used to buffer and upconvert the I and Q baseband signals with the inphase and quadrature IF LOs, respectively. The I and Q modulated signals are then combined to generate the IF signal. In another specific transmitter embodiment, quadrature modulation is performed digitally within the digital processor, and the modulated signal is then upconverted to IF or RF using one or more frequency upconversion stages.

Transmitter 100 can be used in many communication applications, such as cellular communication systems. Examples of cellular communication systems include Code Division Multiple Access (CDMA) communications systems, Time Division Multiple Access (TDMA) communications systems, and analog FM communications systems. CDMA systems are typically designed to conform to the "TIA/EIA/IS-95-A Mobile Station-Base Station Compatibility Standard for Dual-Mode Wideband Spread Spectrum Cellular System," hereinafter referred to as the IS-95-A standard.

The IS-95-A standard requires the output power from a remote station to be adjustable over a range of 85 dB in specified (e.g., 0.5 dB) increments. Typical remote stations are designed to transmit from between approximately −50 dBm to +23 dBm. (IS-95-A specifies the minimum and maximum output power levels of the remote stations.) In some transmitter embodiments, the output PA is designed with a fixed gain but variable drive capability. The variable drive can be provided by a PA design having multiple (i.e., parallel) drivers that can be selectively turned off when not required.

As shown in FIG. 1, a bias control circuit 160a receives gain control signal 128 and can adjust the bias currents of IF buffer 142, mixer 144, and RF VGA 146 based on the received gain control signal. Similarly, a bias control circuit 160b receives gain control signals 128 and 148 and can adjust the bias current of PA 150 based on the received gain control signals.

As shown in FIG. 1, gain control circuit 130 and bias control circuits 160a and 160b are implemented as individual circuits. However, these circuits can also be implemented within a single circuit, or integrated within other circuits such as digital processor 110. The control circuits can also be integrated within the integrated circuit that implements the circuits in the analog signal path.

The foregoing description of the preferred embodiments is provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A linearizer circuit for providing a control signal for a variable gain element comprising:

a first circuit configured to receive an input signal and generate exponentially related signals; and a second circuit, comprising a differential amplifier, coupled to the first circuit, the second circuit configured to receive the exponentially related signals and penetrate the control signal in response to the received exponentially related signals, wherein the second circuit is approximately matched to a gain circuit within the variable gain element, wherein the differential amplifier comprises a pair of transistors coupled together at a common point, wherein one of the exponentially related signals is provided to one of the transistors and another of the exponentially related signals is provided to the common point.

2. The linearizer circuit of claim 1, wherein a base and a collector of the transistor provided with one of the exponentially related signals are coupled together.

3. The linearizer circuit of claim 2, wherein the second circuit further comprises a buffer coupled between the base and the collector of the transistor provided with one of the exponentially related signals.

4. The linearizer circuit of claim 1, wherein the second circuit further comprises a set of resistors coupled to the differential amplifier to match a resistance characteristic of the differential amplifier to that of the gain circuit within the variable gain element.

5. The linearizer circuit of claim 1, wherein the second circuit further comprises a set of resistors coupled to the bases of the pair of transistors.

6. The linearizer circuit of claim 1, wherein the second circuit further comprises a set of resistors coupled to the emitters of the pair of transistors.

7. The linearizer circuit of claim 1, wherein the input signal is temperature compensated such that a ratio of the exponentially related signals is approximately invariant to temperature variations.

8. The linearizer circuit of claim 1, wherein the input signal is continuously adjustable.

9. The linearizer circuit of claim 8, wherein the input signal is further adjustable in discrete steps.

* * * * *

UNITED STATES PATENT AND TRADEMARK OFFICE
CERTIFICATE OF CORRECTION

PATENT NO. : 6,711,391 B1 Page 1 of 1
APPLICATION NO. : 09/686265
DATED : March 23, 2004
INVENTOR(S) : Brett C. Walker, Eric Zeisel and Gurkanwal S. Sahota It is certified that error appears in the above-identified patent and that said Letters Patent is hereby corrected as shown below:

Claim 1 please replace "penetrate" with --generate--

Signed and Sealed this

Fourth Day of September, 2007

JON W. DUDAS
*Director of the United States Patent and Trademark Office*